United States Patent [19]
Kobayashi

[11] Patent Number: 5,387,549
[45] Date of Patent: Feb. 7, 1995

[54] PROCESS FOR FABRICATING OHMIC CONTACT

[75] Inventor: Toshimasa Kobayashi, Kanagawa, Japan

[73] Assignee: Sony Corporation, Tokyo, Japan

[21] Appl. No.: 242,430

[22] Filed: May 13, 1994

[30] Foreign Application Priority Data

May 14, 1993 [JP] Japan .................... 5-136708

[51] Int. Cl.⁶ ............................................. H01L 21/44
[52] U.S. Cl. ........................................ 437/184; 437/188
[58] Field of Search ............... 437/184, 188; 257/743, 257/745

[56] References Cited

U.S. PATENT DOCUMENTS 4,662,060  5/1987  Aina et al. ...................... 257/743
4,794,444 12/1988  Liu et al. ......................... 257/745

FOREIGN PATENT DOCUMENTS 0024928  3/1981  Japan ........................... 437/184

OTHER PUBLICATIONS

A. Christov, *SOlid Phase Formation in Au:Ge/Ni, Ag/In/Ni, In/AuiGe GaAs Ohomic Contact systems*, solid-state electronics vol. 22 pp. 141-149.

Primary Examiner—Brian E. Hearn
Assistant Examiner—Leon Radomsky
Attorney, Agent, or Firm—Hill, Steadman & Simpson

[57] ABSTRACT

An ohmic electrode and a process for fabricating the same, said process comprising forming a first metallic layer comprising indium or an indium alloy on a compound semiconductor layer, forming a second metallic layer comprising a gold-germanium alloy on said first metallic layer, and subjecting the first and the second metallic layer thus obtained to alloying treatment. The present invention provides favorable ohmic contacts by effecting the alloying treatment at a relatively low temperature of 350° C. or even lower.

3 Claims, 4 Drawing Sheets

PROCESS FOR FABRICATING OHMIC CONTACT

BACKGROUND OF THE INVENTION

The present invention relates to an ohmic electrode suitable for use in compound semiconductor devices.

Conventionally, an ohmic electrode of a gallium arsenide (GaAs)-based compound semiconductor device is formed on a GaAs-based semiconductor layer or a GaAs substrate by subjecting a Ni/Au—Ge metallic layer to alloying treatment. More specifically, an ohmic electrode can be formed, for example, by depositing an Au-(12 wt.%)Ge layer, then a nickel layer thereon by means of vacuum deposition process, and alloying the resulting metallic layer by heating it at a temperature range of from 400° to 450° C. for a duration of 1 to 2 minutes.

In the alloying treatment, the Au—Ge alloy is molten to form a liquid phase at a temperature not lower than the eutectic point of 356° C. Because the surface of an n-type GaAs compound semiconductor layer is unsaturated, gallium and arsenic dissolve into the Au—Ge melt during the alloying treatment. Thus is formed an alloy layer comprising, in addition to an Au—Ga alloy, a Ni—As—Ge alloy which results from arsenic, nickel, and germanium that are present in excess. During lowering the temperature, that is, during the re-growth of GaAs, germanium is incorporated into GaAs to occupy the vacancy sites of gallium (Ga) to form an n+layer. Nickel plays a role of absorbing gold and germanium to form a film of Ni—Au—Ge alloy, and of preventing boring up of Au—Ge alloy. An electrode material layer is deposited thereafter on the alloy layer, and is etched into a desired shape to obtain a complete ohmic electrode.

An ohmic contact between the metallic Ni/Au—Ge layer and the base layer, i.e., the GaAs-based semiconductor layer or the GaAs-based substrate, can be formed by alloying the metallic Ni/Au—Ge layer as described above. However, the heat treatment for the alloying must be performed at a temperature in the range of from 400° to 450° C. for a duration of 1 to 2 minutes. The temperature of alloying is sufficiently lower than, for example, the crystal growth temperature for GaAs considering that an MOCVD process is effected at about 800° C. Hence, alloying was believed to be free of problems, i.e., to have no influence on ion implantation and other processes for fabricating compound semiconductor devices.

Considering the process for growing a semiconductor layer of a compound consisting of a Group II and a Group VI element of periodic table (hereinafter referred to simply as a "Group II-VI compound semiconductor") on an n-type GaAs substrate, however, the temperature during the process is maintained at 300° C. or lower. Therefore, problems are encountered in forming an ohmic electrode on the back of an n-type GaAs substrate, because crystal defects and the like generate on the Group II-VI compound semiconductor layer due to the heat treatment, and the crystallinity of the Group II-VI compound semiconductor layer is impaired unfavorably by these defects.

An organic thin film such as of polyimide is used in an optoelectronic integrated device comprising thereon a laser element and an optical waveguide. The organic thin films cannot resist to a heat treatment performed at such a high temperature of 400° C. or even higher. Moreover, such an alloying treatment is problematic in that it generates thermal stress on optical waveguides.

The aforementioned problems can be overcome if the heat treatment is effected at 350° C. or lower. However, considering the metallic layers such as Ni/Au—Ge commonly used at present, no favorable ohmic contact can be realized between the electrode and the compound semiconductor layer or the compound semiconductor substrate by means of a heat treatment effected at a temperature of 350° C. or lower.

In case of a Pd/Ge based metallic layer, T. C. Shen and others report in "Recent Development in ohmic contact for III-V compound semiconductor", in J. Vac. Sci. Technol. B 10(5), September/October (1992) pp. 2113-32 that a favorable ohmic contact is implemented in the temperature range of from 325° to 375° C. However, Pd is thermally unstable, and the alloying process requires an extremely long duration of 30 minutes.

SUMMARY OF THE INVENTION

Accordingly, an object of the present invention is to provide an ohmic electrode suitable for use in compound semiconductor devices, and a process for fabricating the same, which realizes a favorable ohmic contact by a low-temperature alloying treatment that can be effected at a relatively low temperature of 350° C. or lower.

The aforementioned object can be accomplished by an ohmic electrode according to the present invention, characterized in that it is obtained by a process comprising forming a first metallic layer of indium or an indium alloy on a compound semiconductor layer, further forming a second metallic layer of gold-germanium alloy on the first metallic layer, and subjecting the first and the second metallic layers to alloying treatment. The term "compound semiconductor layer" as referred herein not only signifies the compound semiconductor layer formed on an compound semiconductor substrate, but also encompasses the compound semiconductor substrate itself.

DETAILED DESCRIPTION OF PREFERRED EMBODIMENTS

Figure 1A:
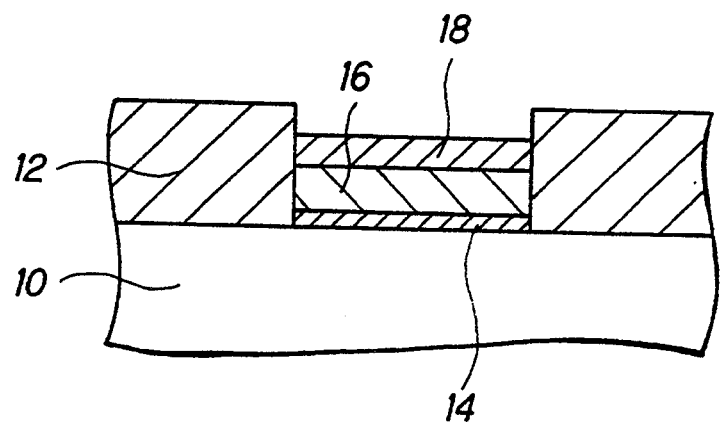
FIGS. 1A, 1B, and 1C are schematically drawn step sequential cross section structures each obtained in a process for fabricating an ohmic electrode according to an embodiment of the present invention.

The ohmic electrode according to the present invention preferably comprises a third metallic layer made of nickel, being formed either on a second metallic layer or interposed between a first and a second metallic layer, so that an ohmic electrode can be obtained by alloying the first, the second, and the third metallic layer. The first metallic layer is preferably formed at a thickness of from 2 nm to 50 nm. If the first metallic layer is formed at a thickness of less than 2 nm, an ohmic contact cannot be realized between the compound semiconductor layer and the metallic layer upon alloying at a temperature of 350° C. or lower. If the first metallic layer is formed at a thickness exceeding 50 nm, on the other hand, the alloying process becomes too time-consuming.

The objects of the present invention described in the foregoing can be accomplished by a process for fabricating an ohmic contact, comprising:

Forming a first metallic layer comprising indium or an indium alloy on a compound semiconductor layer;

Forming a second metallic layer comprising a gold-germanium alloy on said first metallic layer; and Subjecting said first metallic layer and said second metallic layer to alloying treatment at a temperature of 350° C. or lower.

The alloying treatment is effected by heating, as mentioned above, at a temperature of 350° C. or lower, preferably at 320° C. or lower, and more preferably, at 300° C. or lower. The duration of heating is set longer with increasing thickness of the first metallic layer. The lower limit of the heating temperature is determined by measuring the contact resistivity of a contact between the electrode and the compound semiconductor layer provided as a base, however, it is generally higher than 250° C. If the heating temperature should exceed 350° C., the crystallinity of the Group II-VI compound semiconductor becomes impaired; in the case of an optoelectronic device, furthermore, damages occur on the material used, or thermal stress is generated on the optical waveguide. If the heating temperature should be 250° C. or lower, melting into the first metallic layer occurs only insufficiently to prevent contact from forming between the compound semiconductor layer and the second metallic layer. In the latter case, the contact resistivity of the contact between the electrode and the compound semiconductor layer increases unfavorably.

The process for forming an ohmic contact according to the present invention comprises forming a third metallic layer using nickel after forming a first metallic layer made of an indium or an indium alloy on a compound semiconductor layer, or after forming a second metallic layer made of a gold-germanium alloy on the first metallic layer. The step of alloying the first, the second, and the third metallic layer is preferably effected at a temperature not higher than 350° C. Furthermore, the first metallic layer is preferably formed at a thickness of from 2 to 50 nm.

The melting point of indium is 156° C. In the process according to the present invention, it can be seen therefore that the first metallic layer of indium or an indium alloy undergoes melting at a temperature lower than the eutectic point (356° C.) of the gold-germanium alloy. Then, the compound semiconductor layer provided as the base layer and the upper second metallic layer dissolve into the molten first metallic layer to form altogether an alloy layer. Thus, an electrode is obtained from the resulting alloy layer, and this alloy layer also forms an ohmic contact between the compound semiconductor layer provided as the base.

In a case a GaAs layer is provided as the compound semiconductor layer, $Ga_{1-x}In_xAs$ is produced by melting the first metallic layer and the compound semiconductor layer provided as the base. This $Ga_{1-x}In_xAs$ layer has a band gap lower than that of GaAs, and exhibits a nature more similar to that of a metal. Accordingly, the use of $Ga_{1-x}In_xAs$ lowers the contact resistivity.

When heat treatment is applied to a layer of pure indium, indium undergoes melting to form a ball. Accordingly, it is unfeasible to obtain an electrode from a single layer of indium. In the process according to the present invention, however, a second metallic layer is formed on the first metallic layer to prevent the first metallic layer from undergoing a morphological change. Furthermore, it is not possible to realize a highly reliable contact between a single layer of indium and a compound semiconductor layer of GaAs.

The present invention is illustrated in greater detail referring to non-limiting examples below. It should be understood, however, that the present invention is not to be construed as being limited thereto.

EXAMPLE

Referring to the attached figures, the process for fabricating an ohmic electrode according to an embodiment of the present invention is described below.

A GaAs compound semiconductor is fabricated at first by using a conventional process. Referring to FIG. 1A, which shows schematically a partial cross section view of the structure, an epitaxially grown n+-type GaAs compound semiconductor layer 10 is provided as an uppermost layer on a compound semiconductor substrate. Though not shown in the figure, the practical structure comprises a buffer layer, a p-type clad, an active layer, and an n-type clad formed in this order from the substrate side between the compound semiconductor substrate and the compound semiconductor layer 10. Then, an insulating layer 12 made of, for example, SiN, is formed on the compound semiconductor layer 10 in the regions other than those on which the ohmic electrode is to be formed. The insulating layer 12 is formed by an ordinary CVD process and the like. This insulating layer 12 may be omitted in some cases.

A first metallic layer 14 made of indium (In), a second metallic layer 16 made of a gold-germanium alloy containing 12% by weight of germanium, and a third metallic layer 18 made of nickel are formed on the compound semiconductor layer 10 by, for example, vapor deposition assisted by electron beam heating or resistance heating, or any of the known film deposition processes. The metallic layer is patterned thereafter by lift-off process. Specifically, in this example, the first metallic layer 14, the second metallic layer 16, and the third metallic layer 18 were each formed at a thickness of 10 nm, 170 nm, and 40 nm, respectively, to obtain a structure shown in FIG. 1A.

Figure 1B:
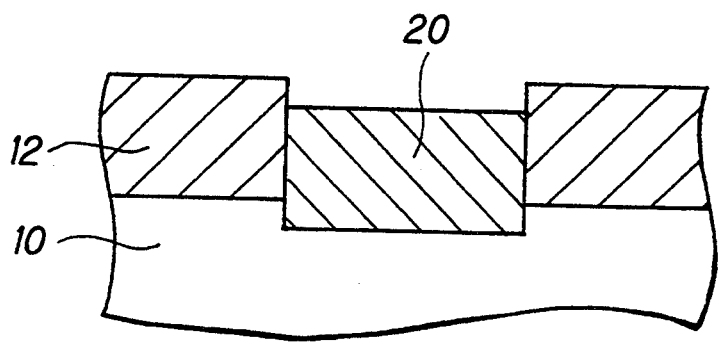

Subsequently, the first, the second, and the third metallic layer are subjected to alloying treatment at a temperature not higher than 350° C. to form an alloy layer 20. The temperature and the duration of the alloying treatment can be modified properly depending on the individual case. In this manner, an alloy can be obtained through the reaction between the metallic layers 14, 16, and 18, specifically, In/Au—Ge/Ni layers to obtain a structure shown in FIG. 1B. Thus is an ohmic electrode implemented.

The alloying treatment can be effected by furnace alloying, which comprises elevating and lowering the temperature of a furnace, by RTA (Rapid Thermal Annealing) alloying using an infrared radiation lamp and the like, or by any known process, under a controlled atmosphere using various types of gases, such as an inert gas (e.g., nitrogen and argon) or a mixed gas using two or more thereof, or a mixed gas containing an inert gas mixed with hydrogen gas, or hydrogen gas alone.

Figure 1C:
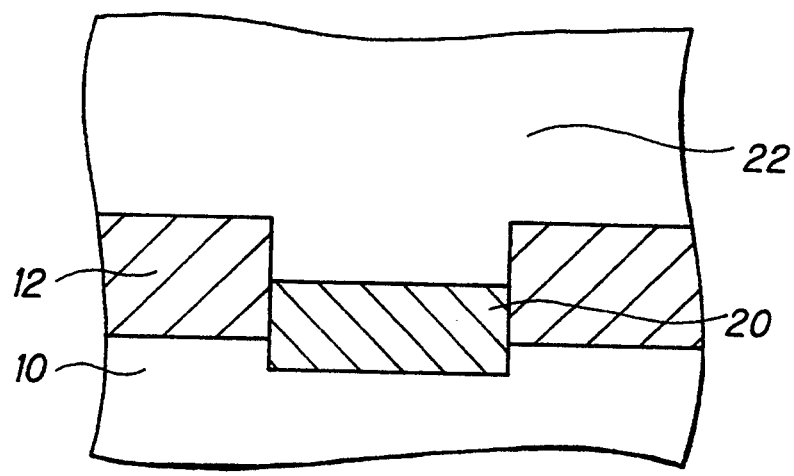

After alloying, an electrode material layer 22 is formed on the alloy layer 20 by means of a known process to obtain a structure shown in FIG. 1C. The electrode material layer 22 may comprise, in this order from the alloy layer 20 side, a 50 nm thick titanium layer, a 50 nm thick tungsten layer, a 50 nm thick titanium layer, a 50 nm thick platinum layer, and a 500 nm thick gold layer. These layers can be deposited by, for example, vapor deposition. The thus obtained electrode material is then patterned by ion-milling and the like to obtain an electrode shaped as desired. Among the multiple layers formed to establish the electrode material layer, the lowermost titanium layer is provided for improving the adhesion strength of the electrode material layer with respect to the alloy layer 20, and the tungsten layer is incorporated to prevent intermetallic reaction from occurring between the lower layers and the upper layers (titanium-platinum-gold layer in this case).

Specimens of ohmic electrode were fabricated according to the described process. The alloying temperature was varied to 250° C., 300° C., 350° C., and 400° C. while maintaining the process duration constant to 10 minutes. The contact resistivity of the contact between the electrode and the compound semiconductor of the thus obtained specimens was measured according to TLM method described in R. Williams, "*Modern GaAs Processing Methods*", Artech House (1990), pp 227. The results are given in FIG. 2A. The observed values are plotted with open circles in the graph. Similarly, the contact resistivity of the contact between the electrode and the compound semiconductor layer of the thus obtained comparative ohmic electrodes was measured by the TLM method. The results are plotted with open rhombohedra in the graph of FIG. 2A.

Figure 2A:
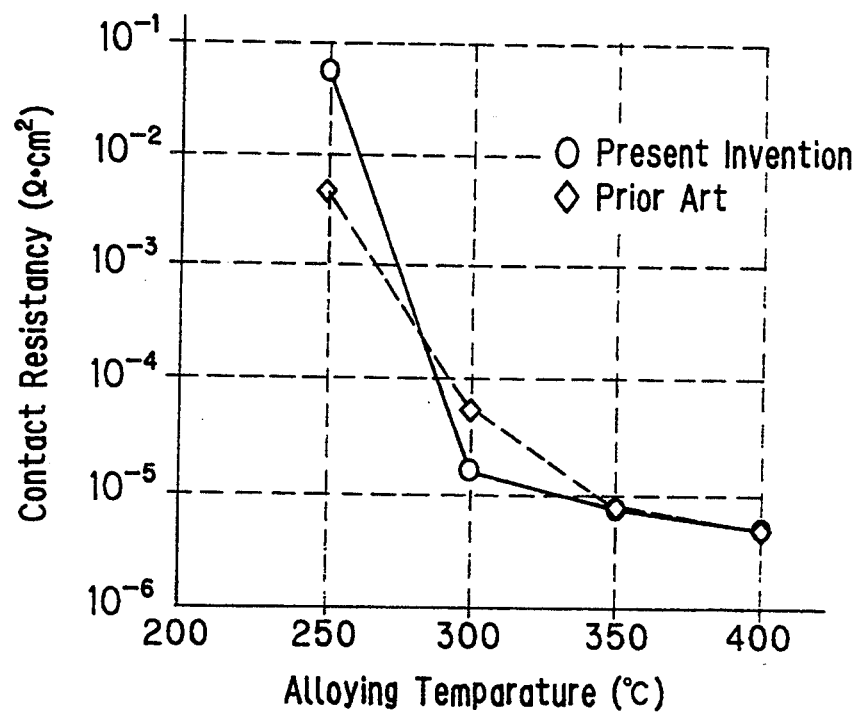
FIGS. 2A and 2B are graphs each showing the change of contact resistivity for a contact between an electrode and a compound semiconductor with varying alloying temperature for an ohmic electrode according to the present invention and one according top j or art, respectively.

FIG. 2A reads clearly that the ohmic electrode fabricated according to the process of the present invention effected at an alloying temperature of 300° C. yield a lower contact resistivity as compared to one obtained by a prior art process.

Figure 2B:
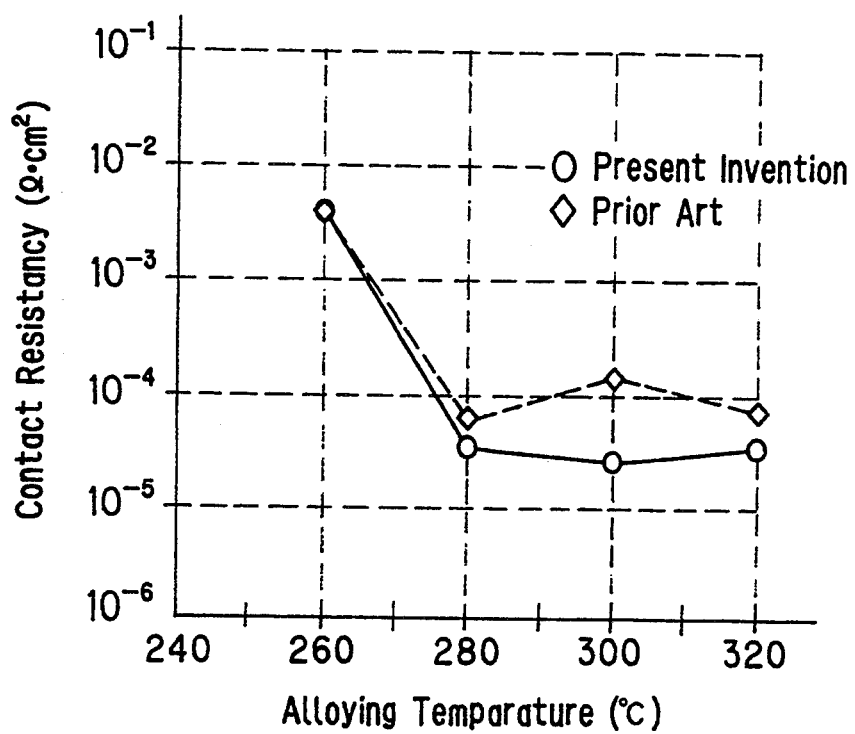

Then, specimens of ohmic electrode were fabricated each by setting the alloying temperature to 260° C., 280° C., 300 ° C, and 320° C. The contact resistivity of the contact between the electrode and the compound semiconductor of the thus obtained ohmic electrode specimens was measured by TLM method. The results are plotted with open circles in the graph of FIG. 2B. For instance, a specimen fabricated by alloying at a temperature of 300° C. and for a duration of 5 minutes was found to yield a contact resistivity Rc of about $2 \times 10^{-5}$ [$\Omega \cdot cm^2$]. Separately, as comparative examples, ohmic electrodes were fabricated in a similar process as in the fabrication of the specimens above, except for not providing the first metallic layer, and for effecting the alloying treatment for a duration of 90 seconds. Similarly, the contact resistivity of the contact between the electrode and the compound semiconductor layer of the thus obtained comparative ohmic electrodes was measured by the TLM method. The results are plotted with open rhombohedra in the graph shown in FIG. 2B. For example, a comparative ohmic electrode obtained by an alloying treatment at 300° C. and for a duration of 90 seconds yielded a contact resistivity Rc of about $1 \times 10^{-4}$ [$\Omega \cdot cm^2$], which is about 5 times as large as the value obtained for an ohmic electrode according to the present invention.

Figure 3:
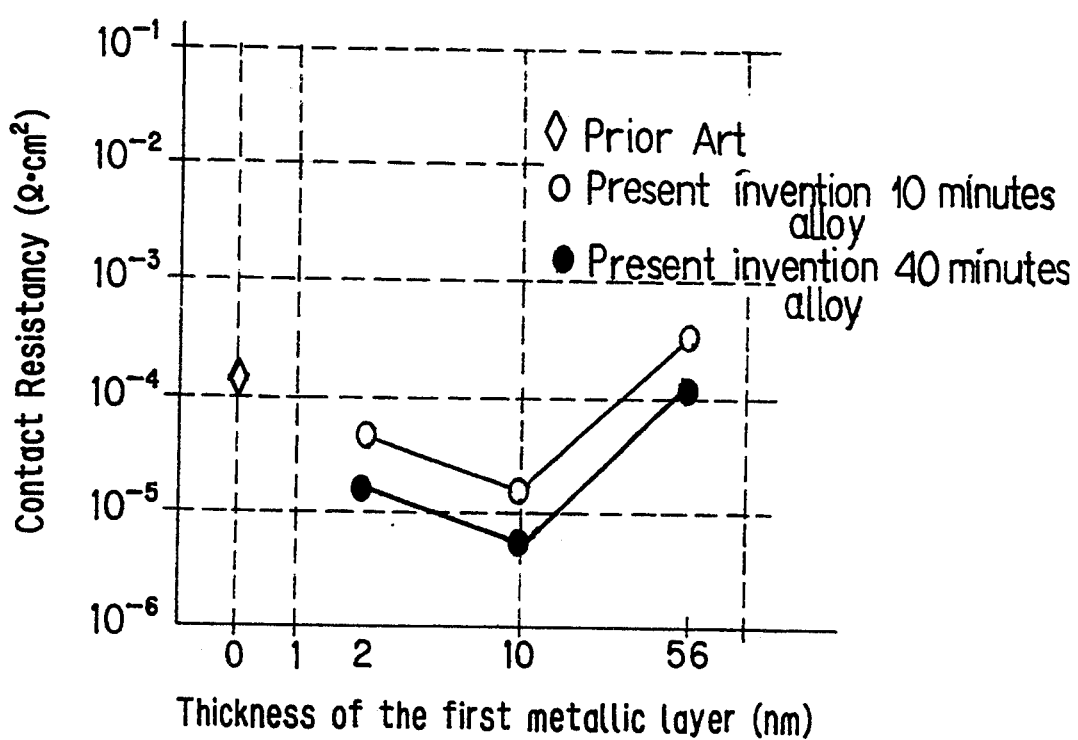
FIG. 3 is a graph showing the change of contact resistivity of a contact between an electrode and a compound semiconductor with varying thickness of the first metallic layer for an ohmic electrode according to the present invention and one according to prior art.

FIG. 3 shows the change of contact resistivity of a contact between the electrode and the compound semiconductor with varying thicknesses of the first metallic layer for both ohmic electrodes according to the present invention and to a prior art. The alloying treatment was performed on all of the specimens at 300° C. The observed value for an ohmic electrode of a conventional type obtained by alloying for a duration of 90 seconds and having no first metallic layer is plotted with an open rhombohedron. The values plotted with an open circle are for the ohmic electrodes according to the present invention, and the alloying treatment in those electrodes was performed for a duration of 10 minutes. The value plotted with a filled circle is also for an ohmic electrode according to the present invention, however, the alloying treatment was performed for a duration of 40 minutes. It can be seen from FIG. 3 that the contact resistivity is lowered as compared to those of the prior art ohmic electrodes by providing the first metallic layer at a thickness of from about 2 to 50 nm.

Figure 4A:
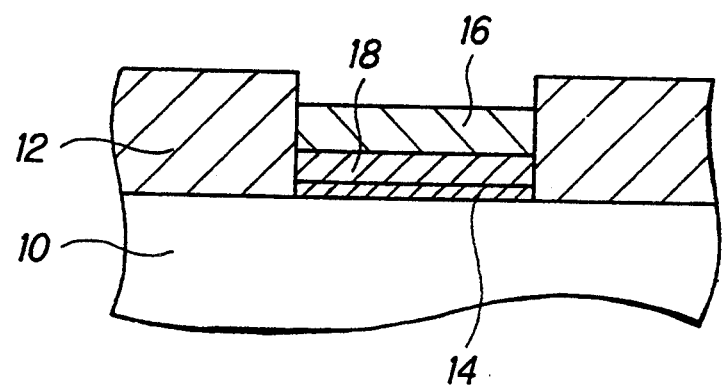
FIGS. 4A and 4B are modified types of metallic layer structure each for forming an ohmic electrode, shown in a state before alloying treatment.
Figure 4B:
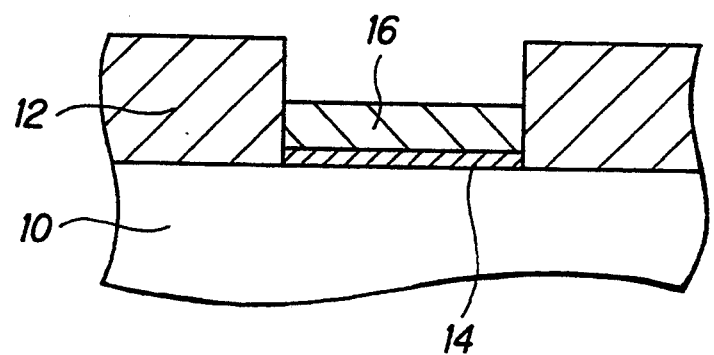

The metallic layer structure prior to the alloying treatment for forming the ohmic electrode can be modified as illustrated in FIG. 4. Referring to FIG. 4A, a third metallic layer 18 is interposed between a first metallic layer 14 and a second metallic layer 16. Referring to FIG. 4B, there is shown a structure in which the third metallic layer is omitted.

The first metallic layer can be formed not only by using indium alone, but also by using indium based alloys such as an indium-gold alloy and an indium-germanium alloy. Furthermore, instead of GaAs, the compound semiconductor layer can be made of any compound semiconductor formed from an Ni/Au—Ge alloy layer in a prior art ohmic electrode, such as $Ga_{1-x}In_xAs$ and $Al_{1-x}Ga_xAs$. The thickness of the first and the third metallic layer is not only limited to those specified in the example above, and can be properly modified as desired. The ohmic electrode according to the present invention can be applied to n-type electrodes to be formed on the back of n-type compound semiconductor substrates.

The present invention comprises forming a first metallic layer made of indium or an indium alloy, and realizes an ohmic electrode at an alloying temperature sufficiently lower than any achieved by a conventional process. Accordingly, the crystallinity of the Group II-VI compound semiconductor layer can be favorably maintained, and the problems, for example, of causing thermal damage on the material used in optoelectronic integrated devices and of generating thermal stress on optical waveguides in the same, can be prevented from occurring.

While the invention has been described in detail and with reference to specific embodiments thereof, it will be apparent to one skilled in the art that various changes and modifications can be made therein without departing from the spirit and scope thereof.

What is claimed is:

1. A process for forming an ohmic electrode, comprising:

forming a first metallic layer comprising indium or an indium alloy on a compound semiconductor layer;

forming a second metallic layer comprising a gold-germanium alloy on said first metallic layer; and subjecting said first and second metallic layers thus obtained to alloying treatment at a temperature of 350° C. or lower.

2. A process for forming an ohmic electrode as claimed in claim 1, which comprises, in addition to the process above, forming a third metallic layer comprising nickel after either forming a first metallic layer comprising indium or an indium alloy on a compound semiconductor layer, or forming a second metallic layer comprising a gold-germanium alloy on said first metallic layer; and subjecting said first, second, and third metallic layers thus obtained to alloying treatment at a temperature of 350° C. or lower.

3. A process as claimed in claim 1, wherein, said first metallic layer is formed with a thickness of from 2 to 50 nm.

* * * * *